United States Patent [19]
Yue

[11] Patent Number: 5,244,819
[45] Date of Patent: Sep. 14, 1993

[54] METHOD TO GETTER CONTAMINATION IN SEMICONDUCTOR DEVICES

[75] Inventor: Jerry C. Yue, Roseville, Minn.

[73] Assignee: Honeywell Inc., Minneapolis, Minn.

[21] Appl. No.: 781,711

[22] Filed: Oct. 22, 1991

[51] Int. Cl.$^5$ .................................... H01L 21/308
[52] U.S. Cl. ............................... 437/11; 437/12; 148/DIG. 24; 148/DIG. 60
[58] Field of Search ..................... 437/11, 12; 148/DIG. 24, DIG. 60

[56] References Cited

U.S. PATENT DOCUMENTS

| | | | |
|---|---|---|---|
| 3,909,307 | 8/1975 | Stein | 148/DIG. 24 |
| 3,923,567 | 12/1975 | Lawrence . | |
| 3,929,529 | 12/1975 | Poponiak | 148/DIG. 24 |
| 3,945,856 | 3/1976 | Koenig et al. | 148/DIG. 60 |
| 4,053,335 | 10/1977 | Hu . | |
| 4,131,487 | 12/1978 | Pearce et al. . | |
| 4,144,099 | 3/1979 | Edmonds et al. . | |
| 4,371,403 | 2/1983 | Ikubo et al. | 437/11 |
| 4,498,227 | 2/1985 | Howell et al. | 437/11 |
| 4,561,171 | 12/1985 | Schlosser . | |
| 4,587,771 | 5/1986 | Buchner et al. . | |
| 4,589,928 | 5/1986 | Dalton et al. . | |
| 4,608,095 | 8/1986 | Hill | 148/33 |
| 4,608,096 | 8/1986 | Hill | 148/33 |
| 4,782,029 | 11/1988 | Takemura et al. | 437/11 |
| 4,796,073 | 1/1989 | Bledsoe | 437/10 |
| 4,878,988 | 11/1989 | Hall et al. | 437/13 |
| 4,962,051 | 10/1990 | Liaw | 437/26 |
| 4,971,920 | 11/1990 | Miyashita et al. | 437/10 |
| 4,980,300 | 12/1990 | Miyashita et al. | 437/10 |
| 4,994,399 | 2/1991 | Aoki | 437/11 |
| 5,025,597 | 6/1991 | Toda et al. . | |
| 5,098,852 | 3/1992 | Niki et al. | 437/11 |
| 5,102,819 | 4/1992 | Matsushita et al. | 437/52 |
| 5,130,260 | 7/1992 | Suga et al. | 148/DIG. 60 |

OTHER PUBLICATIONS

Wolf, *Silicon Processing for the VLSI Era*, vol. 2, Lattice Press, Sunset Beach, 1990 pp. 72-75.

Primary Examiner—Brian E. Hearn
Assistant Examiner—Laura M. Holtzman
Attorney, Agent, or Firm—Gregory A. Bruns

[57] ABSTRACT

A frontside gettering method for removing metallic contamination from a thin film SOI or SOS silicon device. Damage sites are created by ion implantation into inactive regions of a silicon substrate. An annealing step causes metallic contamination to diffuse from the active device region to the inactive region. The inactive region material is removed prior to subsequent processing steps.

15 Claims, 2 Drawing Sheets

METHOD TO GETTER CONTAMINATION IN SEMICONDUCTOR DEVICES

BACKGROUND OF THE INVENTION

The invention relates in general to semiconductor processing and more particularly to techniques and structures for front surface gettering of metallic contamination or impurities in integrated circuits.

In the processing of some semiconductor integrated circuits an epitaxial layer is typically grown on a semiconductor substrate. Growing an epitaxial layer that is free of imperfections, defects and impurities is required to manufacture high quality semiconductor devices. The quality of an epitaxial layer is determined by the quality of the substrate and the epitaxial growth process. Impurities in the substrate will propagate from the substrate to the epitaxial layer during the device fabrication.

Many defects are also generated during the fabrication of Silicon On Insulator (SOI) structures formed by Separation of Silicon by Implantation of Oxygen (SIMOX) method. SIMOX structures are comprised of a substrate, an insulating layer on the substrate, and a top silicon layer on the insulating layer. The insulating layer is used to electrically isolate an integrated circuit fabricated in the top silicon layer from the substrate silicon. This type of structure is typically formed by doing implantation of oxygen into the wafer at a very high dose level. The high beam current needed to achieve the high dose level tends to sputter material of the implant chamber, thus causing metallic contamination.

After implantation the wafer typically undergoes a high temperature anneal process to repair the oxygen implant related damage. This anneal process is frequently done at a temperature of 1300 degrees C. or higher. At such a high temperature, some metallic impurity will come from the diffusion process and diffuse into the silicon substrate.

Once the impurity from the implantation process and the anneal process gets into the silicon wafer it is very difficult to remove it. In the past the approach has been in general to use backside gettering to remove impurities. This approach includes the creation of damage sites on the backside of the wafer. The damage sites on the backside of the wafer may be created by mechanical means, by phosphorous diffusion, by backside nitride deposition, by depositing polysilicon on the backside of the wafer or by ion implantation into the backside of the wafer. Regardless of the specific method the objective is to create gettering sites or damage sites. Once the gettering sites have been created the wafer is put through a high temperature anneal process. During this process the impurities will tend to diffuse to the damage sites and be trapped there.

The method just described does not work for an SOI device, because the silicon layer where the integrated circuits will be fabricated is located on a buried silicon dioxide layer and the damage sites have been created on the backside of the wafer which is on the opposite side of the silicon dioxide layer. The impurities are therefore not able to diffuse through the buried layer to the damage sites. Similarly the method described is not effective for silicon on sapphire (SOS) structures.

Thus a need exists for an effective method of gettering contaminants from silicon devices and a particular need exists for gettering contaminants from SOI and SOS devices.

SUMMARY OF THE INVENTION

The present invention solves these and other needs by providing an effective method of front side gettering. In one embodiment a silicon nitride stack covers the active regions of a silicon on insulator (SOI) wafer. Ion implantation is one of the methods used to create damage sites in the inactive regions of silicon and an annealing step is used to cause impurities to diffuse from the active region to the damage sites or gettering sites in the inactive region. The silicon in the inactive regions that contains the gettered contaminants is then removed by using an etching step. In an alternative embodiment the process is the same up through the annealing step. Following the annealing step the silicon in the inactive regions is consumed by a local oxidation process and is subsequently removed.

DESCRIPTION OF THE PREFERRED EMBODIMENT

The present invention will be described in the context of an SOI semiconductor device. Those skilled in the art will readily understand that the invention is not limited to SOI. The present invention may also be used with silicon on sapphire (SOS) devices.

Figure 1:
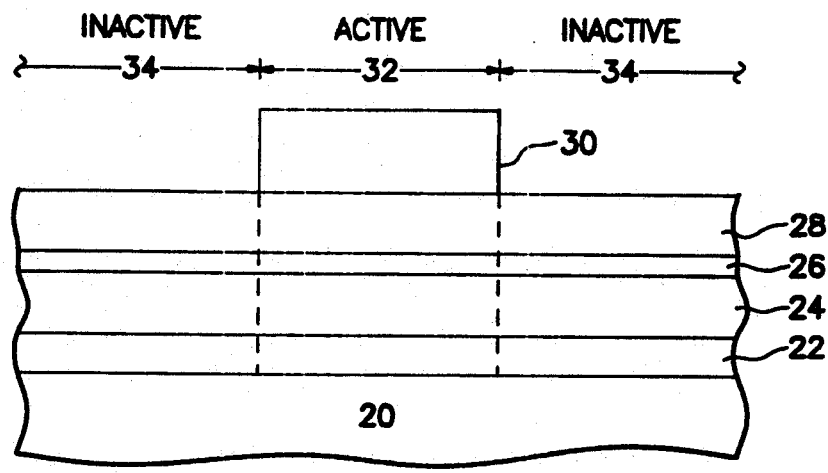
FIGS. 1, 2, 3 and 3a are cross-sectional views of a silicon on insulator device showing steps in accordance with one embodiment of the present invention.

FIG. 1 illustrates a portion of a semiconductor device to be used in the process of the invention. Shown in FIG. 1 is a portion of an SOI device which includes a bulk substrate 20, a buried oxide layer 22 and a silicon substrate 24. Buried oxide layer 22 and silicon substrate 24 will have been formed by implanting a high concentration of oxygen into bulk substrate 20 by a conventional SIMOX means.

In accordance with the method of the present invention, the first step is to grow a thin oxide 26 on silicon substrate 24. Oxide 26 may be thermally grown or may be deposited using chemical vapor deposition (CVD) techniques. The thickness of oxide 26 is not critical, but a thickness in the range of 100 to 500 angstroms is typical.

A masking layer 28 is then applied to oxide layer 26. Suitable masking layer materials include nitride, polysilicon or a photoresist.

The next step is to apply a photoresist material 30. The photoresist will define the active device area or region. The active device area is the area that will be used for integrated circuit devices. The active device area is defined by being covered by the photoresist 30 and the inactive area or region is defined by being exposed. The active device area in the drawings are designated 32 and the inactive area is designated 34.

Figure 2:
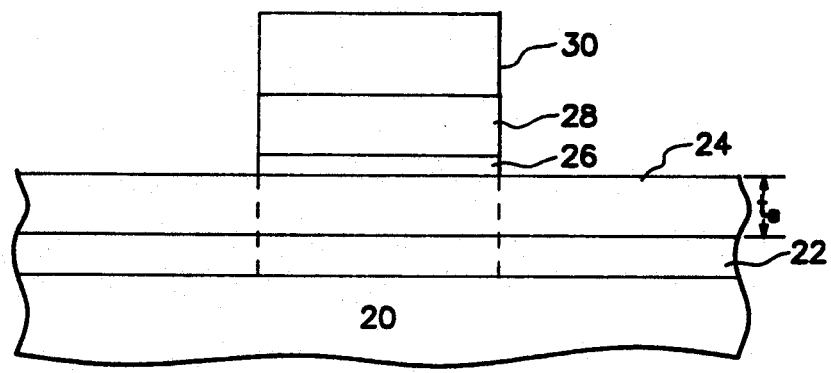

Following the defining of active area 32 and inactive area 34 by photoresist 32, the next step is to remove both the portion of the masking layer 28 that is in the inactive area and the portion of the oxide layer 26 that is in the inactive area. The resulting structure is as shown in FIG. 2.

Figure 3:
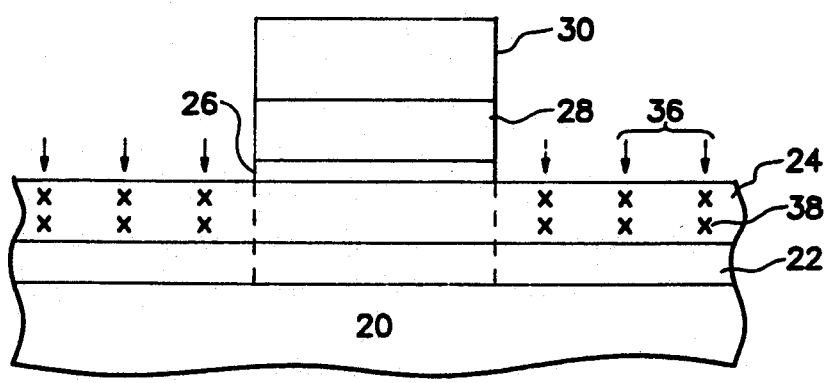

To continue with the process as illustrated in FIG. 3, ion implantation 36 is used to create gettering sites or damage sites 38 in inactive area 34, of silicon layer 24. Argon, Phosphorous or other elements may be used to create damage sites 38. The dopant which is selected is implanted with a dose level preferably in the range of $1 \times 10^{15}$ ions/cm$^2$ to $1 \times 10^{16}$ ions/cm$^2$. The implantation energy is preferably in the range of 50 KeV to 150 KeV.

Following the ion implantation step that created damage sites 38, the wafer must undergo a high temperature processing step to cause the metallic contamination or impurities to diffuse from active area 32 of silicon layer 24 to inactive area 34 of silicon layer 24 and thus to the gettering sites. The temperature for this process is not critical but preferably is in the range of 800° C. to 1000° C.

Figure 3A:
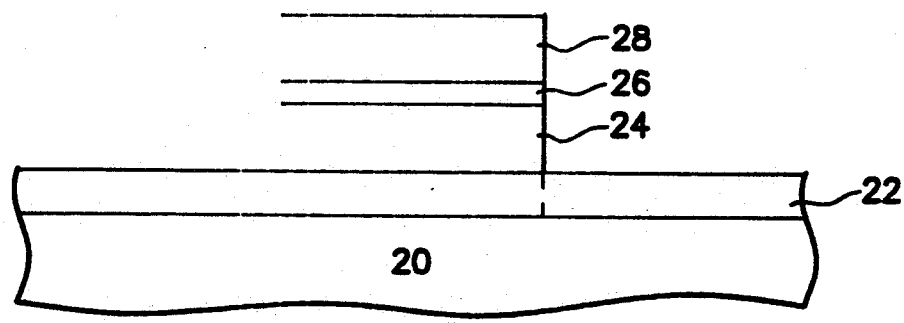

After the metallic contamination has diffused to damage sites 38, there are two alternative methods available to remove the semiconductor material containing the contamination. Referring to FIGS. 3 and 3a, the first method may be explained. FIG. 3 illustrates the damage sites 38 to which the metallic contamination has diffused. In FIG. 3 the photoresist 30, nitride 28 and oxide 26 stack covers the active area 32 of silicon layer 24. A reactive ion etch (RIE) process may be used to remove the portion of silicon in the inactive area which contains the contamination. The process will stop when it reaches oxide layer 22 and is therefore easily controlled.

Figure 3B:
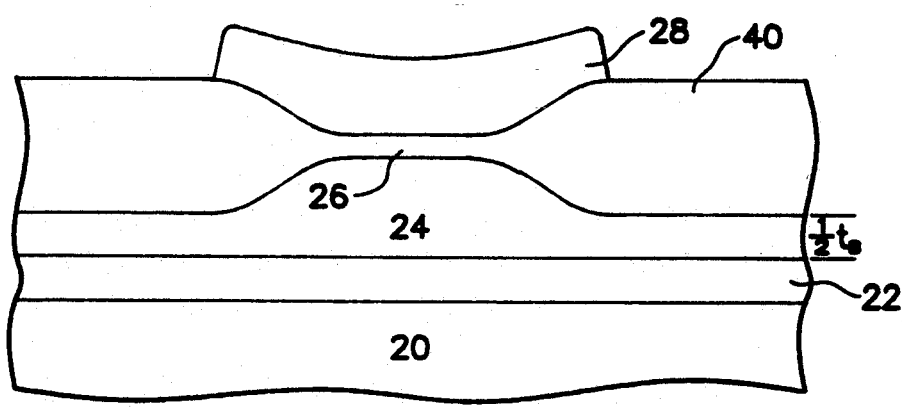
FIGS. 3b and 3c are cross-sectional views of a silicon on insulator device showing steps in accordance with an alternative embodiment of the present invention.
Figure 3C:
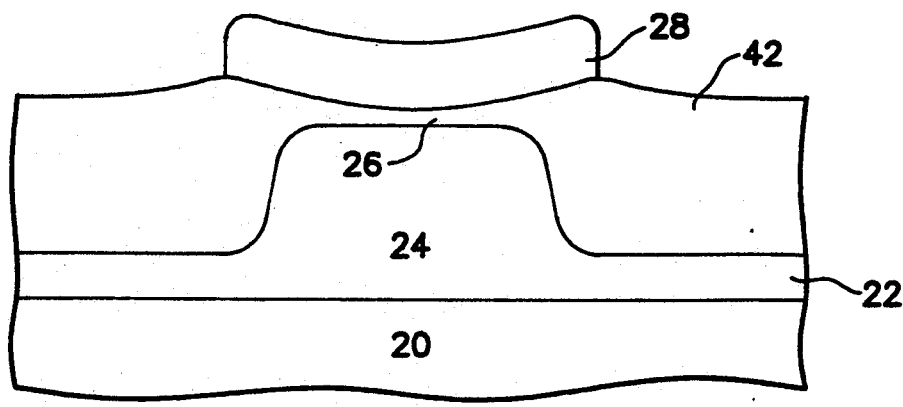

A second method of removing the contaminated material makes use of local oxidation (LOCOS) and may be explained as follows. Photoresist 30 can also be removed by conventional means. In FIG. 3a nitride 28 and oxide 26 stack covers the active area 32 of silicon layer 24 and provides a mask that will prevent oxidation in the active area. In FIG. 2, the thickness of silicon layer 24 is designated as $t_s$. To use the LOCOS process, the wafer should then be processed through a thermal oxidation step to provide a thermally grown oxide 40 as shown in FIG. 3b. The temperature processing step can be designed so that ½ of silicon layer 24 or ½ $t_s$ is consumed by converting the Silicon into silicon dioxide. After the first LOCOS step is completed, the silicon dioxide can be removed through conventional means such as by an etchant dip. The structure will then be as shown in FIG. 3c. The remaining ½ of silicon layer 40 may again be processed through a temperature step to oxidize the remainder of silicon layer 24 and this silicon dioxide 42 may then be removed using conventional means for mesa-type of isolation process or remain on the surface as an oxide isolation layer.

The embodiments of an invention in which an exclusive property or right is claimed are defined as follows:

1. A method of gettering metallic contamination in an integrated circuit wafer, comprising the steps of:
   providing an insulating substrate;
   providing a silicon substrate on said insulating substrate, said silicon substrate containing said metallic contamination;
   forming an oxide layer on said silicon substrate;
   forming a masking layer on said oxide layer, said masking layer having covered portions defining active device regions in said silicon substrate, said masking layer having exposed portions defining inactive regions in said silicon substrate;
   implanting ions into said inactive regions to create damage sites in said inactive region of said silicon substrate;
   performing at least a high temperature annealing step to cause said metallic contamination to migrate from said active device region to said damage sites;
   removing at least a portion of said inactive regions of said silicon substrate; and
   performing subsequent integrated circuit wafer processing steps.

2. The method of claim 1 wherein said step of removing at least a portion of said inactive regions of said silicon substrate includes the step of performing a reactive ion etch process.

3. The method of claim 1 wherein said step of removing said inactive regions of said silicon substrate includes the step of performing a local oxidation process.

4. The method of claim 1 wherein said inactive region substantially surrounds said active region.

5. The method of claim 1 wherein said insulating substrate is silicon dioxide.

6. The method of claim 1 wherein said insulating substrate is Sapphire.

7. A method to getter contamination in a silicon-on-insulator intergrated circuit device, comprising:
   providing a semiconductor substrate comprising a silicon layer on a buried oxide layer;
   forming an oxide layer on said silicon layer;
   forming a masking layer on said oxide layer;
   forming a photoresist mask on said masking layer, said photoresist mask having covered areas to define active device regions, said photoresist mask having exposed areas to define inactive regions;
   removing said masking layer and said oxide layer from said inactive regions;
   creating gettering sites in said inactive region of said silicon layer,
   performing at least a subsequent high temperature semiconductor processing step to cause said contamination to migrate to said gettering sites, and;
   removing said inactive region of said silicon layer.

8. The method of claim 7 wherein said masking layer is silicon nitride.

9. The method of claim 8 wherein said step of creating gettering sites includes implanting ions selected from a group including Argon and Phosphorous.

10. The method of claim 7 wherein said step of removing said inactive regions of said silicon layer includes using a reactive ion etch process.

11. The method of claim 7 wherein said step of removing inactive regions of said silicon layer includes performing at least a local oxidation step and a local oxidation removal step.

12. The method of claim 7 wherein said inactive region substantially surrounds said active region.

13. A method to getter contamination in a silicon-on-insulator intergrated circuit device, comprising:
   providing a sapphire substrate;
   providing a silicon layer on said sapphire substrate;
   forming an oxide layer on said silicon layer;
   forming a masking layer on said oxide layer;
   forming a photoresist mask on said masking layer, said photoresist mask having covered areas to define active device regions, said photoresist mask having exposed areas to define inactive regions;
   removing said masking layer and said oxide layer from said inactive regions;
   creating gettering sites in said inactive region of said silicon layer,
   performing at least a subsequent high temperature semiconductor processing step to cause said contamination to migrate to said gettering sites, and;
   removing said inactive region of said silicon layer.

14. The method of claim 13 wherein said masking layer is silicon nitride.

15. The method of claim 13 wherein said step of creating gettering sites includes implanting ions selected from a group including Argon and Phosphorous.

* * * * *